(12) United States Patent
Rosen

(10) Patent No.: US 7,685,456 B1
(45) Date of Patent: Mar. 23, 2010

(54) DDR INTERFACE BUS CONTROL

(75) Inventor: Eitan Rosen, Abirim (IL)

(73) Assignee: Marvell Israel (MISL) Ltd., Yokneam (IL)

( * ) Notice: Subject to any disclaimer, the term of this patent is extended or adjusted under 35 U.S.C. 154(b) by 1409 days.

(21) Appl. No.: 10/631,327

(22) Filed: Jul. 30, 2003

(51) Int. Cl.
*G06F 1/04* (2006.01)

(52) U.S. Cl. .................. 713/500; 713/400; 713/601

(58) Field of Classification Search .......... 713/400, 713/500, 601
See application file for complete search history.

(56) References Cited

U.S. PATENT DOCUMENTS

| | | | | |
|---|---|---|---|---|
| 4,344,127 | A * | 8/1982 | McDaniel et al. .............. 700/1 |
| 5,355,468 | A * | 10/1994 | Jeppesen et al. ............. 714/34 |
| 5,418,822 | A | 5/1995 | Schlachter et al. |
| 5,732,249 | A * | 3/1998 | Masuda et al. ............. 713/503 |
| 5,964,856 | A * | 10/1999 | Wu et al. .................... 710/110 |
| 6,240,043 | B1 | 5/2001 | Hanson et al. |
| 6,407,963 | B1 | 6/2002 | Sonoda et al. |
| 6,442,102 | B1 | 8/2002 | Borkenhagen et al. |
| 6,453,381 | B1 | 9/2002 | Yuan et al. |
| 6,525,981 | B2 | 2/2003 | Ryan |
| 6,600,681 | B1 | 7/2003 | Korger et al. |
| 6,785,189 | B2 | 8/2004 | Jacobs et al. |
| 0,018,494 | A1 | 1/2005 | Wu et al. |
| 6,898,722 | B2 * | 5/2005 | Anzai ........................ 713/500 |
| 6,957,399 | B2 | 10/2005 | Emberling et al. |
| 7,089,509 | B2 | 8/2006 | Emberling et al. |
| 7,219,269 | B2 | 5/2007 | Frisch |
| 7,257,036 | B2 | 8/2007 | Chang et al. |
| 7,345,933 | B1 | 3/2008 | Telem et al. |
| 2001/0014053 | A1 | 8/2001 | Li |
| 2003/0031081 | A1 | 2/2003 | Suzuki et al. |
| 2003/0140080 | A1 | 7/2003 | Friend et al. |
| 2004/0019816 | A1 * | 1/2004 | Smith et al. ................. 713/400 |
| 2005/0015560 | A1 | 1/2005 | Bae |
| 2006/0017480 | A1 | 1/2006 | Lin |

OTHER PUBLICATIONS

Rabaey et al., "Digital Integrated Circuits: a design perspective", 2003, Pearson Education, $2^{nd}$ ed. pp. 453-459.
Marvell International Ltd.; Discovery LT MIPS System Controller, MV64420; 2004, 2 pages.
Micron Technology, Inc.; TN-46-05 General DDR SDRAM Functionality, Technical Note; Jul. 2001; 11 pages.
Lattice Semiconductor Corporation; Dedicated DDR Memory Interface Circuitry, Mar. 17, 2005; 2 pages.

* cited by examiner

*Primary Examiner*—Tse Chen

(57) ABSTRACT

Systems and techniques for improved bus control, which may be particularly useful for double data rate (DDR) data transfer. A circuit may include a clock transmitter in communication with a clock bus, a clock receiver in communication with the clock bus, and a driver in communication with the clock bus. The driver may drive a voltage of the clock bus to a first voltage level when the clock transmitter is not transmitting a clock signal on the clock bus and the clock receiver is not receiving a clock signal on the clock bus.

28 Claims, 4 Drawing Sheets

US 7,685,456 B1

DDR INTERFACE BUS CONTROL

TECHNICAL FIELD

This invention relates to systems implementing double data rate (DDR) protocol.

BACKGROUND

DDR protocol refers to a data transfer protocol that allows for data to be fetched on both the rising and falling edges of a clock (referred to as a data strobe or DQS), thus doubling the effective data transfer rate.

FIG. 1 shows a system 100 for DDR data transfer. A first data processing device 110 includes a DQS driver 112 and a data driver 114 for driving (respectively) a clock signal and data to another device such as device 120 via a DQS bus 130 and a data bus 140. Device 110 also includes a DQS receiver 113 to receive a clock signal via DQS bus 130 and a data receiver 115 to receive data via data bus 140. System 100 uses parallel termination for DQS bus 130; that is, bus 130 is in communication with a termination voltage $V_{tt}$ via a resistor 150 with resistance R.

According to DDR protocol, a device driving data also drives the DQS signal. That is, if device 110 is driving data to device 120 via data bus 140, device 110 is also driving a DQS signal to device 120 via DQS bus 130. Conversely, if device 120 is driving data to device 110, it is driving both the data and the DQS signal.

FIG. 2 shows an example of a signal on a parallel terminated DQS bus 130 as a function of time, as first device 110 sends data to second device 120, which in turn sends data to first device 110.

Prior to transmitting data, first device 110 pulls the voltage on DQS bus 130 to zero, then transmits the clock signal as shown. First device 110 concludes data transmission at $t_1$ by transmitting a zero on DQS bus 130. First device 110 then relinquishes control of DQS bus 130.

Between $t_1$ and $t_2$, neither device is transmitting data, so neither is driving a signal on DQS bus 130. For a series terminated bus, the voltage on DQS bus 130 would generally remain in the most recently asserted (zero) state. However, for a parallel terminated bus (as shown in FIG. 1), the voltage on DQS bus 130 drifts up to the termination voltage $V_{tt}$. $V_{tt}$ is generally a voltage that corresponds to neither a logical one nor a logical zero. Therefore, for parallel termination, DQS bus 130 is generally in an unknown state between the time first device 110 relinquishes bus 130 ($t_1$) and the time the second device 120 drives bus 130 to the zero state ($t_2$). When bus 130 is in an unknown state, associated input devices, such as devices 110 and 120, are unable to discern a change in state corresponding to a device taking control of bus 130. Devices 110 and 120 may thus be unable to determine whether DQS bus 130 and data bus 140 are available to transmit data to another device.

SUMMARY

In general, in one aspect, a circuit includes a driver in communication with a clock bus. The circuit may also include a clock transmitter in communication with a clock bus to transmit a clock signal on the clock bus. The circuit may also include a clock receiver in communication with the clock bus to receive a clock signal on the clock bus.

The driver may drive a voltage of the clock bus to a first voltage level when the clock transmitter is not transmitting a clock signal on the clock bus and the clock receiver is not receiving a clock signal on the clock bus. The first voltage level may correspond to a logical one or a logical zero.

The driver may include a resistance. For example, the driver may include a first resistance between the clock bus and a voltage $V_{DD}$ and a second resistance between the clock bus and ground. The resistances may be provided using resistors. The driver may include a transistor.

The circuit may include enabling circuitry in communication with the driver. The enabling circuitry may enable the driver when the clock transmitter is not transmitting a clock signal on the clock bus and the clock receiver is not receiving a clock signal on the clock bus. The enabling circuitry may also disable the driver when the clock transmitter is not transmitting a clock signal on the clock bus and the clock receiver is not receiving a clock signal on the clock bus.

The circuit may further include receive processing circuitry in communication with the enabling circuitry. The receive processing circuitry may include a receive processing clock, which may turn off in response to a signal from the enabling circuitry.

The driver may be included in a packet processor. The packet processor may be configured to transmit data and to receive data according to a double data rate (DDR) protocol. The circuit may also include a memory. The memory may be configured to transmit data and to receive data according to the DDR protocol. The memory may include a clock transmitter in communication with the clock bus, a clock receiver in communication with the clock bus, and a driver in communication with the clock bus.

In general, in one aspect, a method includes determining that no device is transmitting a clock signal on a clock bus, driving a clock bus to a first voltage, determining that the voltage of the clock bus is equal to the first voltage, and driving the clock bus to a second voltage different than the first voltage. The first voltage may be a logical one or a logical zero. The method may also include driving a clock signal on the clock bus, and may include driving a data signal synchronized with the clock signal on a data bus.

In general, in one aspect, a circuit includes a voltage driving means in communication with a clock bus. The voltage driving means may be for driving a voltage of the clock bus to a first voltage level when a clock signal transmission means is not transmitting a clock signal on the clock bus and a clock signal receiving means is not receiving a clock signal on the clock bus. The first voltage level may correspond to a logical one or a logical zero.

The details of one or more implementations are set forth in the accompanying drawings and the description below. Other features and advantages will be apparent from the description and drawings, and from the claims.

DETAILED DESCRIPTION

As noted above, a parallel terminated DQS bus is generally in an unknown state after a device relinquishes control of the bus. Therefore, bus control in DDR data transfer can be quite complicated. For example, a device may need to be capable of performing complex timing calculations to determine whether the bus is available for transmitting data to one or more other devices. These calculations may be unreliable for systems operating at high frequencies, as well as for systems in which devices are physically separated by an appreciable distance.

Figure 1:
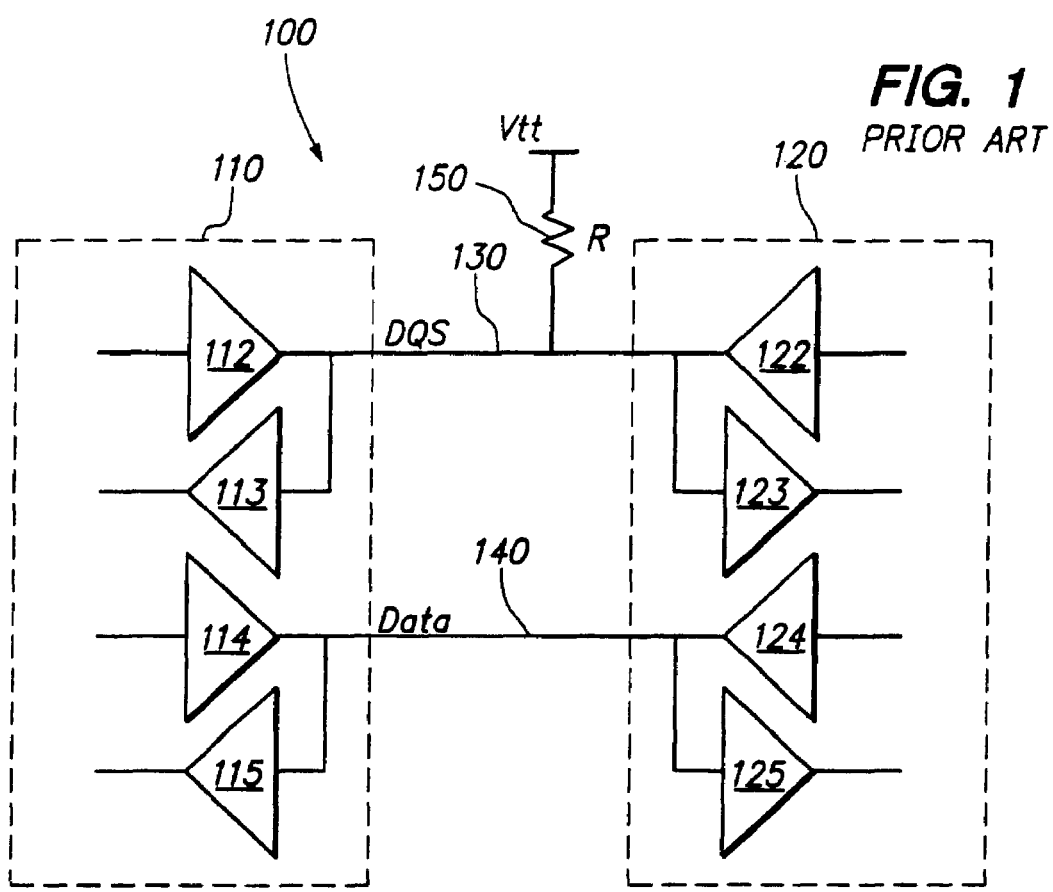
FIG. 1 is a schematic of a system to transmit data according to a DDR protocol, according to the prior art.
Figure 2:
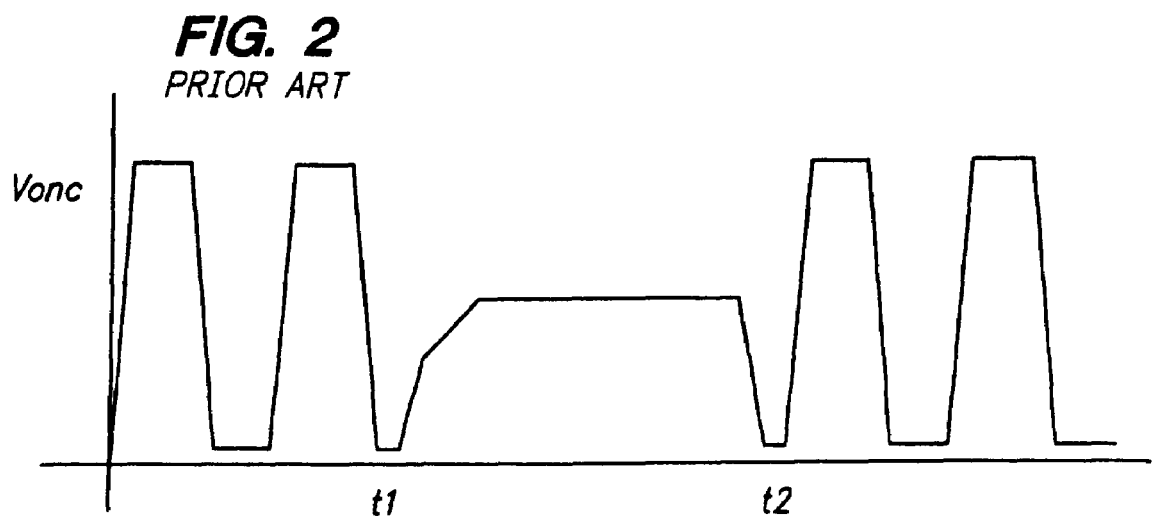
FIG. 2 is a plot of the voltage on a DQS bus versus time using a system such as that shown in FIG. 1.
Figure 3:
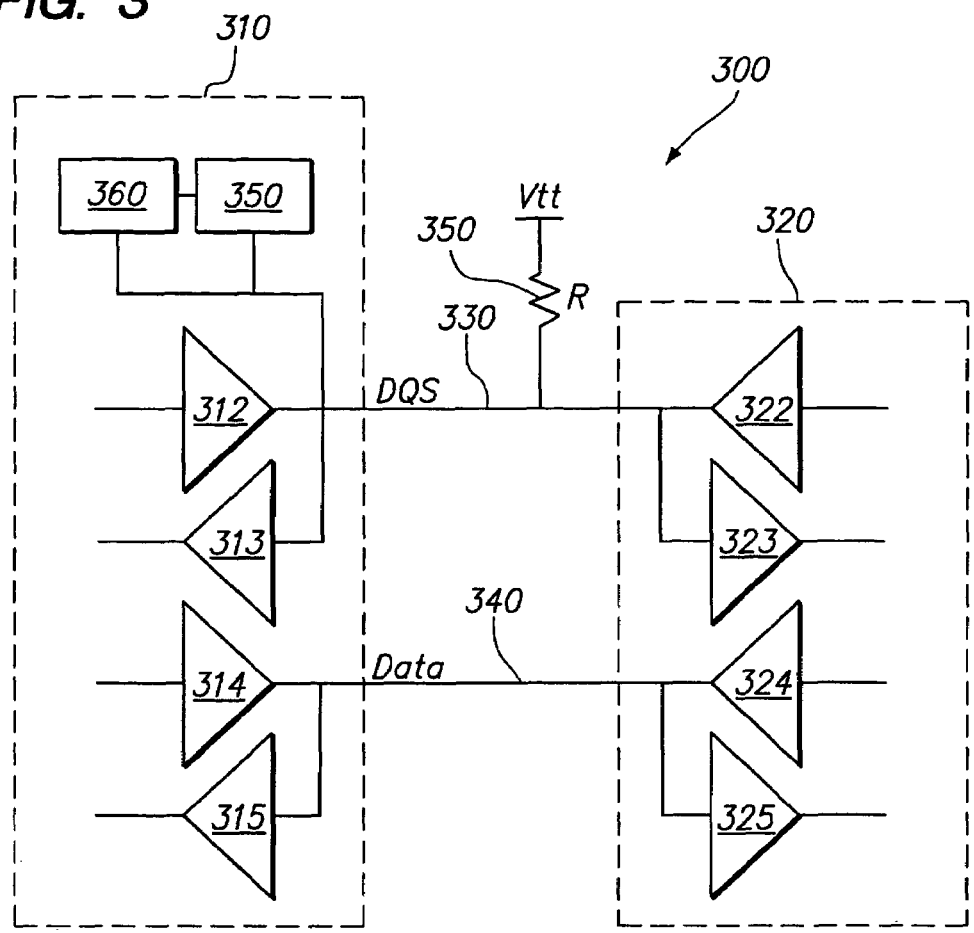
FIG. 3 is a schematic of a system to transmit data according to a DDR protocol, according to an implementation.

FIG. 3 shows a system 300 that provides for improved control of the DQS and data buses for DDR data transfer. System 300 includes a first device 310 with a DQS driver 312 and a DQS receiver 313 for sending and receiving a DQS signal to a second device 320 via a parallel terminated DQS bus 330. Second device 320 includes a DQS driver 322 and a DQS receiver 323. Similarly, first device 310 includes a data driver 314 and a data receiver 315, while second device 320 includes a data driver 324 and a data receiver 325. Data is transmitted between devices such as first device 310 and second device 320 on a data bus 340. Although a single line is shown, data bus 340 may be a multi-line bus.

First device 310 further includes a driver 350 in communication with DQS bus 330. Driver 350 may be a weak pull-up, so that when a DQS driver such as DQS driver 322 is driving a clock signal on DQS bus 330, driver 350 has little or no effect on the clock signal.

However, driver 350 is configured so that when no devices are driving a signal on DQS bus 330, the voltage on DQS bus 330 is driven to a voltage corresponding to a logical one. That is, driver 350 pulls DQS bus 330 to a voltage above the threshold voltage at which devices such as first device 310 and second device 320 recognize the voltage on DQS bus 330 as a logical one. In some implementations, driver 350 is enabled only at particular times, which may includes times in which no device is driving a clock signal on DQS bus 330.

In an implementation, first device 310 is a packet processor and second device 320 is a memory. First device 310 transmits data to second device 320, requests data from second device 320, and receives requested data from second device 320. Second device 320 receives data requests from first device 310 and transmits requested data accordingly.

As shown in FIG. 3, DQS bus 330 is parallel terminated by virtue of resistor 350 between DQS bus 330 and ground. However, in other implementations, a different termination mechanism may be used (e.g., DQS bus 330 may be series terminated).

Figure 4:
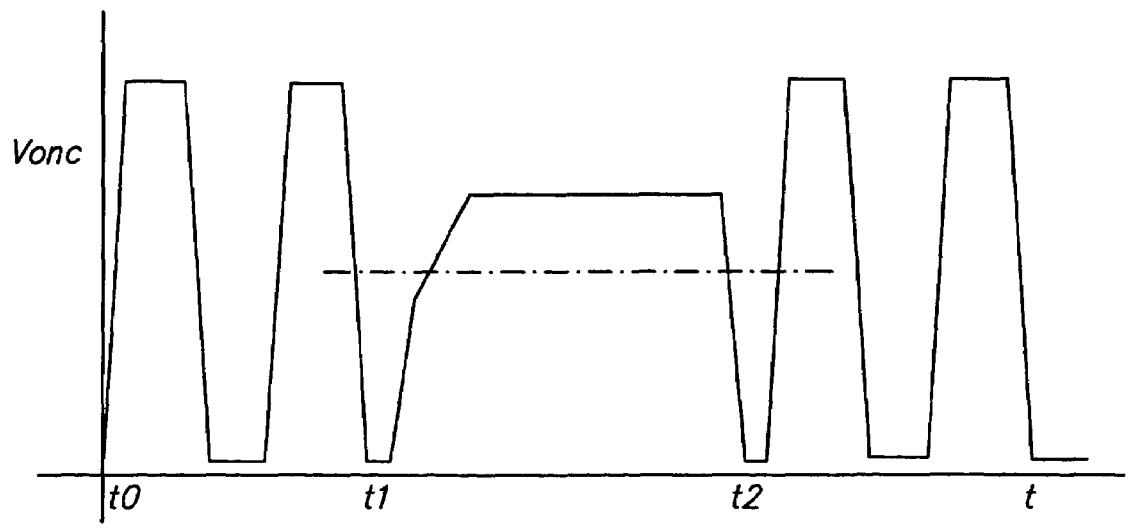
FIG. 4 is a plot of the voltage on a DQS bus versus time using a system such as that shown in FIG. 3.

FIG. 4 shows the voltage as a function of time for an implementation such as that shown in FIG. 3. At time t0, first device 310 transmits data to second device 320. First device 310 relinquishes control of DQS bus 330 at a time $t_1$. Rather than drifting to a voltage corresponding to an unknown state, driver 350 pulls the voltage on DQS bus 330 to a voltage corresponding to a logical one.

At time $t_2$, second device 320 takes control of DQS bus 330 by bringing the voltage on DQS bus 330 down to zero. First device 310 recognizes the change in voltage from a value corresponding to a logical one to a value corresponding to a logical zero, and therefore recognizes that data from second device 320 will be transmitted at the next rising edge. Thus, a system such as that shown in FIG. 3 and described above provides easier and more reliable DQS bus control.

In some implementations, each device in communication with DQS bus 330 may include a driver such as driver 350. In some implementations, not all devices may include a driver. For example, in the implementation described above with first device 310 implemented as a packet processor and second device 320 implemented as a memory, a driver 350 may be included in first device 310 but not in second device 320. Since second device 320 only transmits data in response to a request from first device 310, first device 310 may determine whether DQS bus 330 is available based on the amount of data received from second device 320 and act accordingly.

For example, first device 310 may request a particular number of bits of data from second device 320. First device 310 may determine that second device 320 is transmitting data by sensing a change in the voltage on DQS bus 330 from a voltage corresponding to a logical one to a voltage corresponding to a logical zero. As first device 310 receives data, it may count the number of bits received and thus determine when second device 320 has completed data transmission. First device 310 may subsequently enable driver 350 to bring the voltage on DQS bus 330 to a voltage corresponding to a logical one.

In some implementations, system 300 may include enabling circuitry 360 to enable and disable driver 350. For example, enabling circuitry 360 may enable driver 350 whenever no clock signal is being driven on DQS bus 330. Alternately, enabling circuitry 360 may not enable driver 350 under some circumstances. For example, first device 310 may request a number of data transfers from second device 320. If first device 310 does not need to transmit data to second device 320 between data transfers, enabling circuitry 360 may not enable driver 350 between data transfers. Since first device 310 is not transmitting data the voltage on DQS bus 330 may be allowed to drift to an unknown state between data bursts from second device 320.

Figure 5:
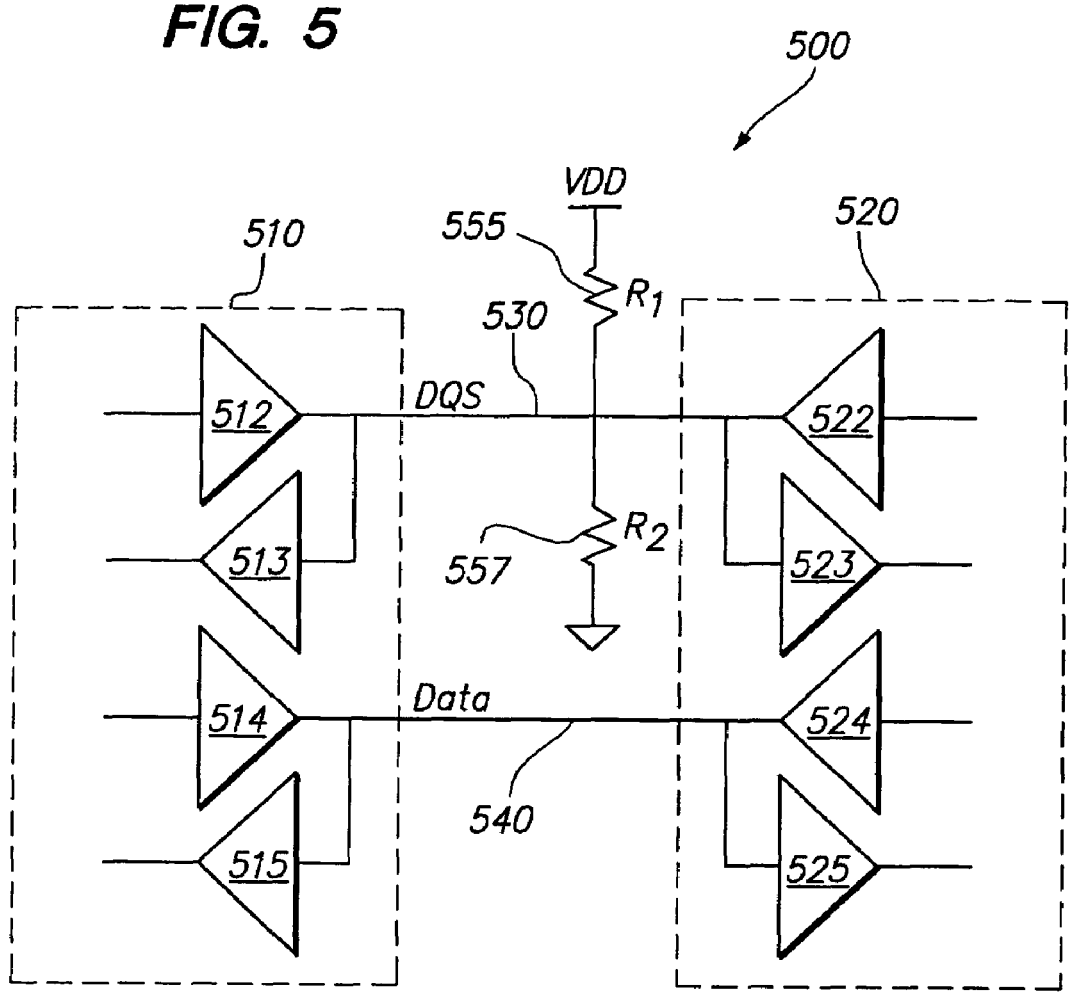
FIG. 5 is schematic of an implementation of a DDR data transfer system incorporating a resistive driver.

Driver 350 may be implemented in a number of ways. FIG. 5 shows a system 500 where an additional driver is implemented using resistance to provide an offsetting bias. Rather than a single resistor to a termination voltage $V_{tt}$, system 500 includes a first resistor 555 between a DQS bus 530 and $V_{DD}$, as well as a second resistor 557 between DQS bus 530 and ground.

First resistor 555 has a resistance of $R_1$, while second resistor 557 has a resistance of $R_2$. In order to weakly drive the voltage of DQS bus 530 to a voltage corresponding to a logical one, $R_1$ and $R_2$ should be large. The relative values of $R_1$ and $R_2$ determine the voltage on DQS bus 530. Generally, when $R_2$ is slightly larger than $R_1$, the voltage on DQS bus 530 may be driven to an appropriate voltage.

Figure 6:
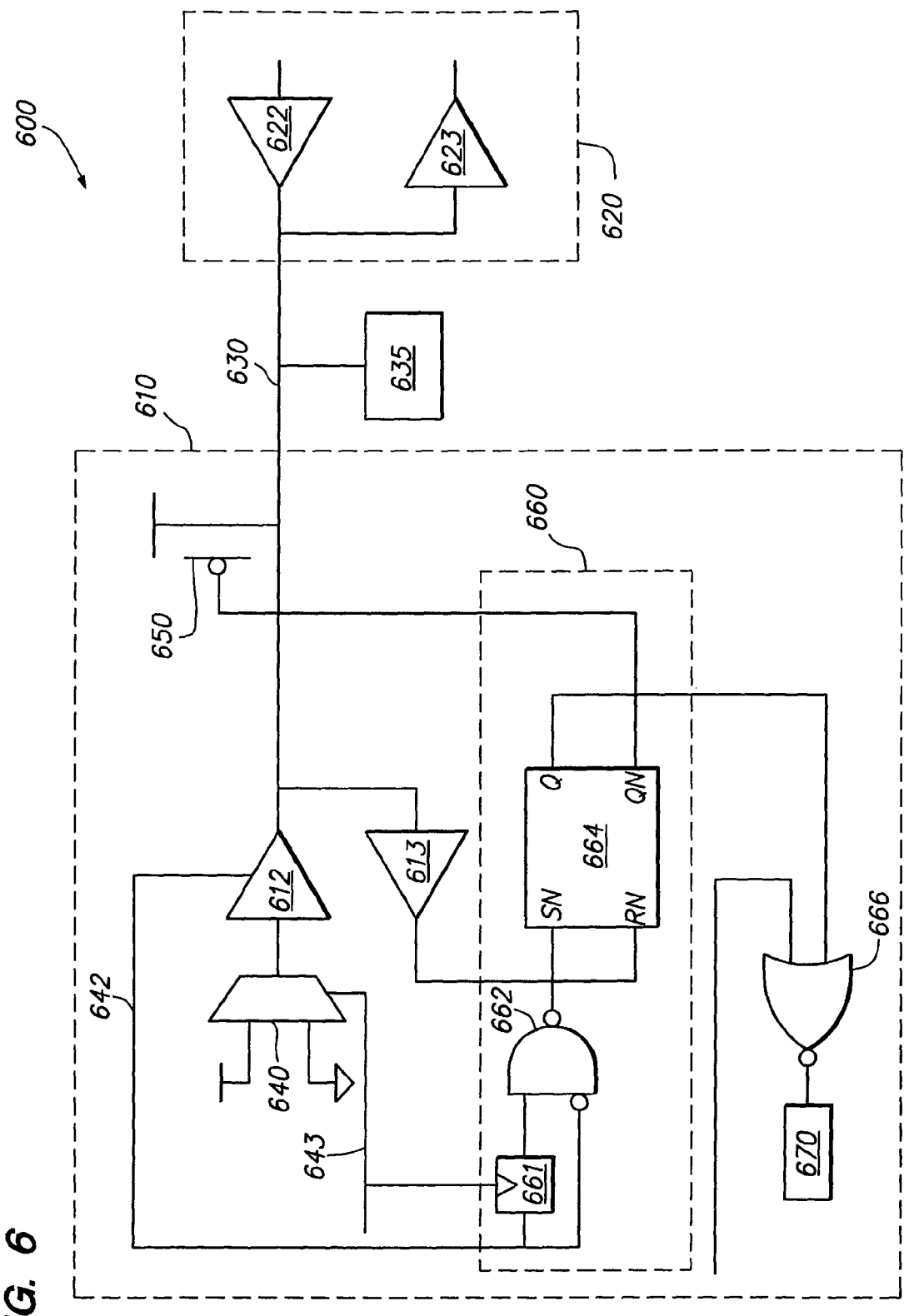
FIG. 6 is schematic of an implementation of a DDR data transfer system incorporating enabling circuitry.

The implementation of FIG. 5 may provide an appropriate bias voltage to DQS bus 530. However, since the resistors are in place during transmission of the clock signal on DQS bus 530, the clock signal may be affected. FIG. 6 shows an alternate implementation of a system 600 in which a driver may be enabled only when no device is driving the DQS bus.

System 600 includes a first device 610 with a DQS driver 612 and a DQS receiver 613 in communication with a DQS bus 630. Parallel termination of DQS bus 630 is provided by a termination mechanism 635. System 600 further includes a second device 620 with a DQS driver 622 and a DQS receiver 623.

Device 610 includes a driver 650, which is generally weaker than both DQS driver 612 and DQS driver 622, so that the DQS drivers can pull the voltage on DQS bus 630 to a zero upon taking control of DQS bus 630. For example, driver 650 may be a transistor. Device 610 also includes a multiplexer (MUX) 640, which is controlled by a clock signal 643. When clock signal 643 is toggling, MUX 640 outputs clock signal 643 to DQS driver 612.

A device enable signal 642 is input to driver 612. Device enable signal 642 is asserted when device 610 is to take control of DQS bus 630. In response, the clock signal output from MUX 640 is communicated on DQS bus 630 to receiver 623 of second device 620. In order to relinquish control of DQS bus 630, device enable signal 642 is disasserted.

System 600 may also include enabling circuitry 660 to enable and disable driver 650. Enabling circuitry 660 may include, for example, a flip flop 661, a chopping device 662, and a flip flop 664. Device enable signal 642 is sampled by a flip flop 661. Signal 642 is delayed by a cycle and output to a chopping device 662. Chopping device 622 outputs a negative pulse of one cycle to set a flip flop 664. When flip flop 664 is set, Q is one and QN is zero, enabling driver 650.

When a device such as device 620 takes control of DQS bus 630 by pulling the voltage down to zero, RN would be set to one to reset flip flop 664. Driver 650 would then be disabled (QN would be set to one).

Thus driver 650 may be disabled in one of two ways. First, when device enable signal 642 is asserted (i.e., device 610 itself is transmitting data), driver 650 may be disabled. Additionally, when a different device takes control of DQS bus 630, the output of flip flop 664 disables driver 650.

The output of flip flop 664 may also be used to enable receive circuitry 670 for processing a signal received by DQS receiver 613. A gate 666 receives both output Q of flip flop 664 and device enable 642. When both inputs are low, DQS receiver 613 is receiving live data on a data bus (not shown). In response, gate 666 outputs a signal to turn on a receive enable clock in receive circuitry 670 to enable receive circuitry to process the data. Such an implementation may provide for lower power consumption, since the receive circuitry need not be powered at all times.

A number of implementations have been described. Nevertheless, it will be understood that various modifications may be made without departing from the spirit and scope of the invention. For example, although the driver is shown as included in a device in communication with the DQS bus, it may be implemented as part of different circuitry. Accordingly, other implementations are within the scope of the following claims.

What is claimed is:

1. A circuit, comprising: a clock transmitter in communication with a clock bus, the clock transmitter to transmit a clock signal on the clock bus; a clock receiver in communication with the clock bus, the clock receiver to receive a clock signal on the clock bus; and a driver in communication with the clock bus, the driver to drive and maintain a voltage of the clock bus to a first voltage level while the clock transmitter is not transmitting a clock signal on the clock bus and the clock receiver is not receiving a clock signal on the clock bus; the circuit further including enabling circuitry in communication with the driver, the enabling circuitry to enable the driver when the clock transmitter is not transmitting a clock signal on the clock bus and the clock receiver is not receiving a clock signal on the clock bus.

2. The circuit of claim 1, wherein the first voltage level is a voltage level corresponding to a logical one.

3. The circuit of claim 1, wherein the driver includes a resistance.

4. The circuit of claim 3, wherein the driver includes a first resistance between the clock bus and a voltage VDD, and wherein the driver further includes a second resistance between the clock bus and ground.

5. The circuit of claim 1, wherein the driver includes a transistor.

6. The circuit of claim 1, the enabling circuitry further to disable the driver when the clock transmitter is not transmitting a clock signal on the clock bus and the clock receiver is not receiving a clock signal on the clock bus.

7. The circuit of claim 1, further including receive processing circuitry in communication with the enabling circuitry, the receive processing circuitry including a receive processing clock, the receive processing clock to turn off in response to a signal from the enabling circuitry.

8. The circuit of claim 1, wherein the enabling circuitry includes a flip flop.

9. The circuit of claim 8, wherein the enabling circuitry enables the driver when the flip flop is in a first state, and wherein the enabling circuitry disables the driver when the flip flop is in a second state.

10. The circuit of claim 1, wherein the driver is included in a packet processor.

11. The circuit of claim 1, wherein the driver is included in a packet processor configured to transmit data and to receive data according to a double data rate protocol.

12. The circuit of claim 11, further including a memory.

13. The circuit of claim 12, wherein the memory is configured to transmit data and to receive data according to the double data rate protocol.

14. The circuit of claim 12, wherein the memory includes:
another clock transmitter in communication with the clock bus, the another clock transmitter to transmit a clock signal on the clock bus;
another clock receiver in communication with the clock bus, the another clock receiver to receive a clock signal on the clock bus; and
another driver in communication with the clock bus, the another driver to drive the voltage of the clock bus to the first voltage level when the another clock transmitter is not transmitting a clock signal on the clock bus and the another clock receiver is not receiving a clock signal on the clock bus.

15. A circuit, comprising: a clock signal transmission means in communication with a clock bus, the clock signal transmission means for transmitting a clock signal on the clock bus; a clock signal receiving means in communication with the clock bus, the clock signal receiving means for receiving a clock signal on the clock bus; and a voltage driving means in communication with the clock bus, the voltage driving means for driving and maintaining a voltage of the clock bus to a first voltage level while the clock signal transmission means is not transmitting a clock signal on the clock bus and the clock signal receiving means is not receiving a clock signal on the clock bus; the circuit further including enabling means in communication with the voltage driving means, the enabling means for enabling the voltage driving means when the clock signal transmission means is not transmitting a clock signal on the clock bus and the clock signal receiving means is not receiving a clock signal on the clock bus.

16. The circuit of claim 15, wherein the first voltage level is a voltage level corresponding to a logical one.

17. The circuit of claim 15, wherein the voltage driving means includes a resistance means.

18. The circuit of claim 17, wherein the voltage driving means includes a first resistance means between the clock bus and a voltage VDD, and wherein the voltage driving means further includes a second resistance means between the clock bus and ground.

19. The circuit of claim 15, wherein the voltage driving means includes a transistor.

20. The circuit of claim 15, the enabling means further for disabling the voltage driving means when the clock signal transmission means is not transmitting a clock signal on the clock bus and the clock signal receiving means is not receiving a clock signal on the clock bus.

21. The circuit of claim 15, further including receive processing means in communication with the enabling means, the receive processing means including a receive processing clock means, the receive processing clock means to turn off in response to a signal from the enabling means.

22. The circuit of claim 15, wherein the enabling means includes a flip flop.

23. The circuit of claim 22, wherein the enabling means enables the driving means when the flip flop is in a first state, and wherein the enabling means disables the driver when the flip flop is in a second state.

24. The circuit of claim 15, wherein the voltage driving means is included in a packet processing means.

25. The circuit of claim 24, wherein the packet processing means is for transmitting data and for receiving data according to a double data rate protocol.

26. The circuit of claim 25, further including a memory means.

27. The circuit of claim 26, wherein the memory means is for transmitting data and for receiving data according to the double data rate protocol.

28. The circuit of claim 26, wherein the memory means includes:
- another clock signal transmission means in communication with a clock bus, the another clock signal transmission means for transmitting a clock signal on the clock bus;
- another clock signal receiving means in communication with the clock bus, the another clock signal receiving means for receiving a clock signal on the clock bus; and
- another voltage driving means in communication with the clock bus, the another voltage driving means for driving a voltage of the clock bus to a first voltage level when the another clock signal transmission means is not transmitting a clock signal on the clock bus and the another clock signal receiving means is not receiving a clock signal on the clock bus.

* * * * *